US006281734B1

(12) United States Patent
McClure et al.

(10) Patent No.: US 6,281,734 B1
(45) Date of Patent: Aug. 28, 2001

(54) REFERENCE VOLTAGE ADJUSTMENT

(75) Inventors: David C. McClure, Carrollton; Rong Yin, Coppell, both of TX (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 09/476,036

(22) Filed: Dec. 31, 1999

(51) Int. Cl.[7] .......................................... H03L 5/00

(52) U.S. Cl. .......................... 327/308; 327/525; 327/543

(58) Field of Search ................................ 327/308, 525, 327/538, 540, 541, 543, 545, 546

(56) References Cited

U.S. PATENT DOCUMENTS 5,627,493 * 5/1997 Takeuchi et al. .................... 327/546

* cited by examiner

*Primary Examiner*—Jeffrey Zweizig
(74) *Attorney, Agent, or Firm*—Theodore E. Galanthay; Lisa K. Jorgenson; Daniel E. Venglarik

(57) ABSTRACT

A reference voltage trim circuit includes a voltage follower receiving the reference voltage to be trimmed, with one or more resistive loads providing predefined voltage shifts serially connected between the output of the voltage follower and the output of the trim circuit. The voltage follower includes a current mirror differential amplifier receiving the reference voltage at one input and the output of the voltage follower at the other input, and a transistor with a resistive load connected between the power supply voltages and receiving the output of the current mirror differential amplifier at the transistor's gate. The resistive loads provide varying preselected voltage drop and are each shunted by corresponding fuses, with the entire series of resistive loads shunted by a master fuse. To trim the reference voltage, at least the master fuse is blown, together with the fuse(s) shunting resistive loads which combine to result in the desired trim voltage. Pass gates control which end of the resistive load series is connected to the output of the voltage follower and which is connected to the output of the trim circuit. To decrement the reference voltage, a first end is connected to the output of the voltage follower and the second end is connected to trim circuit output; to increment the reference voltage, the second end of the resistive load series is connected to the voltage follower output and the first end is connected to the trim circuit output.

17 Claims, 3 Drawing Sheets

REFERENCE VOLTAGE ADJUSTMENT

BACKGROUND OF THE INVENTION

1. Field of the Invention

The present invention relates to integrate circuits, and particularly to reference voltages within integrated circuits. Still more particularly, the present invention relates to adjustment of reference voltages within integrated circuits.

2. Description of the Prior Art

Many integrated circuits are implemented by way of circuits that are controlled by a reference voltage. Therefore, proper circuit operation in modem digital integrated circuits, particularly those fabricated utilizing complementary metal-oxide-semiconductor (CMOS) technology, often depends upon the availability of an accurate, stable reference voltage. For example, many functional circuits internal to an integrated circuit rely upon current sources that conduct a stable current. Examples of such functional circuits include differential amplifiers, current mirrors, operational amplifiers, level shift circuits, and circuits that themselves generate reference voltages. Since current sources are generally implemented as a field effect transistor receiving a reference voltage at its gate, the stability of the current source, and proper operation of the circuit containing the current source, depends upon the accuracy and stability of the reference voltage applied to the gate of the field effect transistor. Other circuits, particularly those that control the switching response of logic circuits within modem integrated circuits, may use a series field effect transistor with its gate controlled by a reference voltage to control the switching speed, or slew rate, of the circuit. The reference voltages used in these circuits is produced by a voltage reference circuit, or bias circuit, that is preferably designed to provide a stable and accurate reference voltage.

Adjustment to a voltage reference value is sometimes required to compensate for processing variations. For example, tight operational tolerances may require trim capability within the circuit to achieve the narrow window of proper operation over variations in silicon processing. Such trim capability generally includes fuses, typically blown with lasers for adjustment of the reference voltage. However, trim capability is difficult to add to some circuits generating reference voltages, particularly where fuse adjustment can cause variations over voltage due to cancellation of terms in the reference voltage output equation which will no longer cancel after fuses are blown.

It would be desirable, therefore, to provide trim up and trim down capability for any reference voltage being utilized, enabling operation within a tightly spaced window.

SUMMARY OF THE INVENTION

A reference voltage trim circuit includes a voltage follower receiving the reference voltage to be trimmed, with one or more resistive loads providing predefined voltage shifts serially connected between the output of the voltage follower and the output of the trim circuit. The voltage follower includes a current mirror differential amplifier receiving the reference voltage at one input and the output of the voltage follower at the other input, and a transistor with a resistive load connected between the power supply voltages and receiving the output of the current mirror differential amplifier at the transistor's gate. The resistive loads provide varying preselected voltage drop and are each shunted by corresponding fuses, with the entire series of resistive loads shunted by a master fuse. To trim the reference voltage, at least the master fuse is blown, together with the fuse(s) shunting resistive loads which combine to result in the desired trim voltage. Pass gates control which end of the resistive load series is connected to the output of the voltage follower and which is connected to the output of the trim circuit. To decrement the reference voltage, a first end is connected to the output of the voltage follower and the second end is connected to trim circuit output; to increment the reference voltage, the second end of the resistive load series is connected to the voltage follower output and the first end is connected to the trim circuit output.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DETAILED DESCRIPTION

Figure 1:
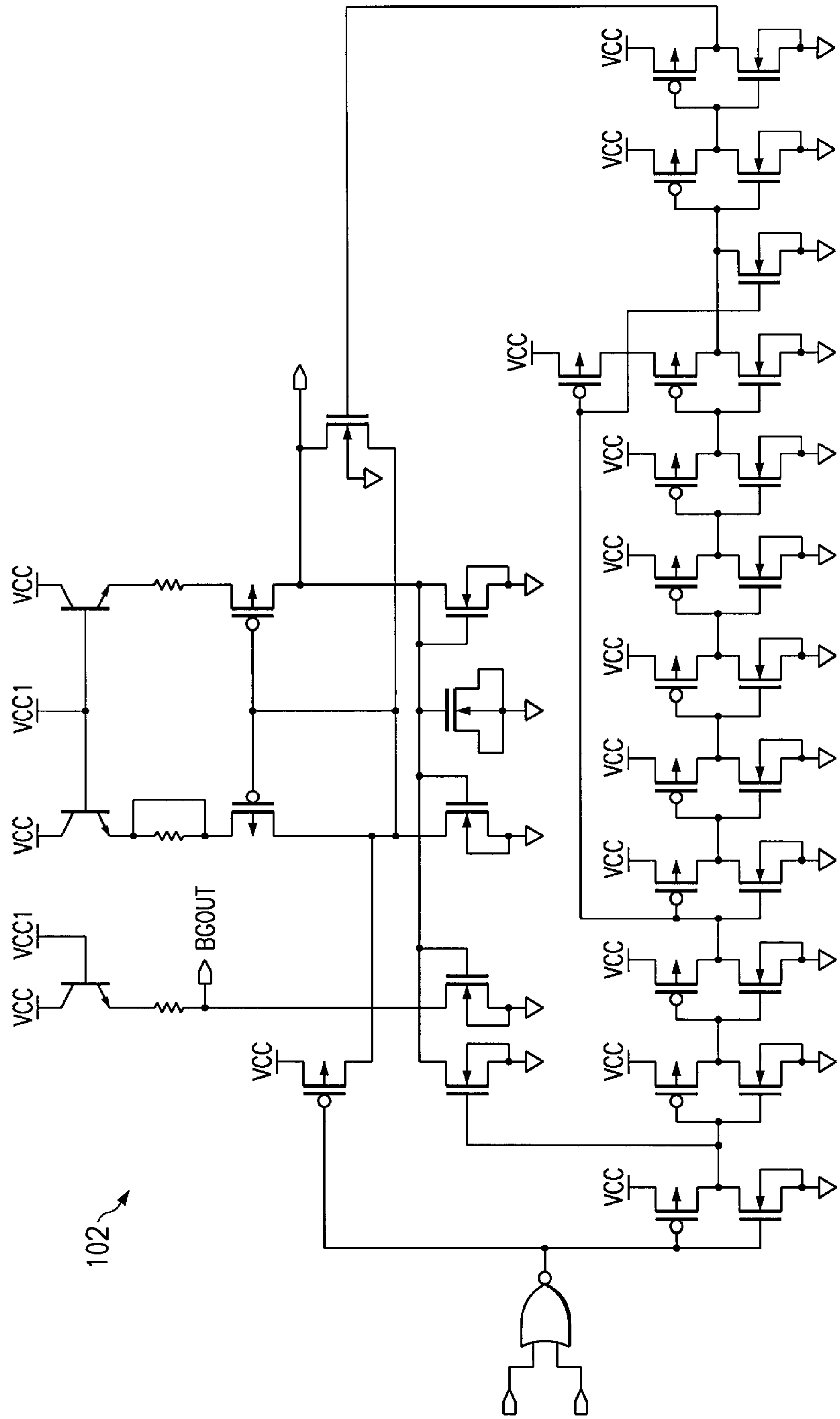
FIGS. 1 and 2 depict circuit diagrams for a reference voltage circuit generating a reference voltage which may be adjusted in accordance with a preferred embodiment of the present invention.
Figure 2:
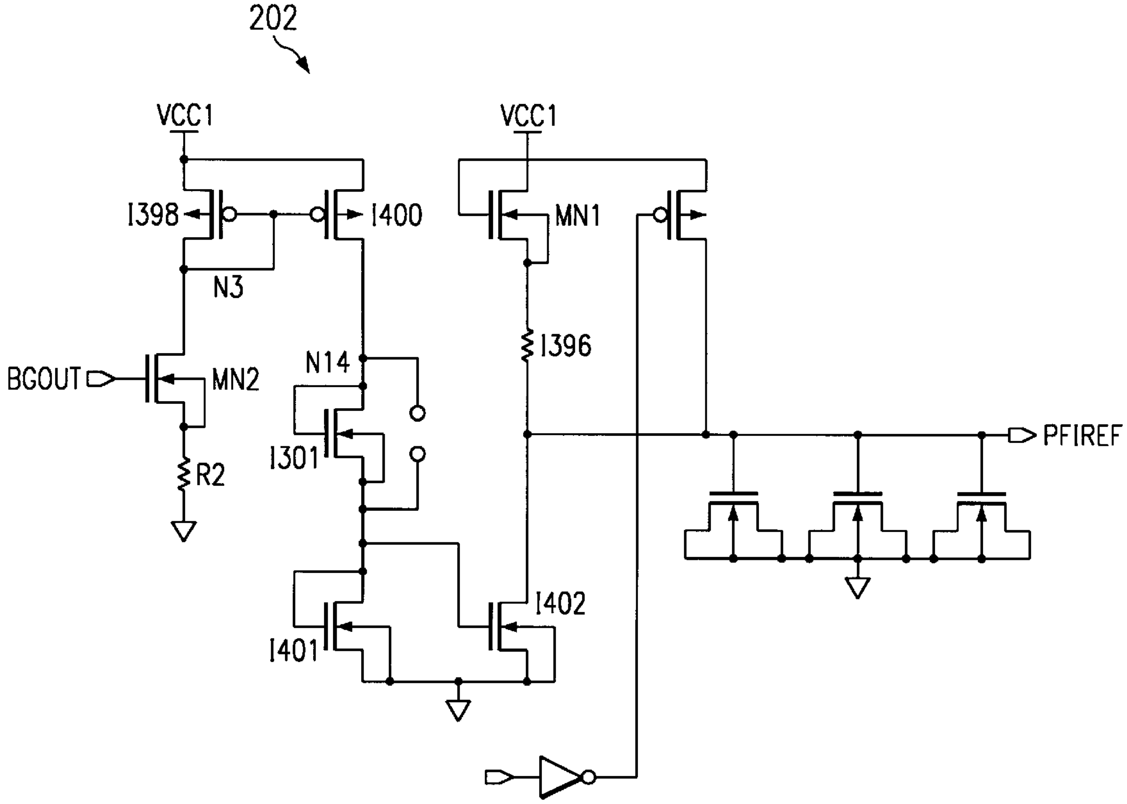

With reference now to the figures, and particularly with reference to FIGS. 1 and 2, circuit diagrams for a reference voltage circuit generating a reference voltage which may be adjusted in accordance with a preferred embodiment of the present invention are depicted. These circuits form part of a Power Failure In, Power Failure Out (PFI/PFO) function within an integrated circuit, in which the PFI input voltage is compared to a reference voltage for the power failure threshold and the PFO output is asserted if the PFI input voltage is less than the power failure threshold. This function is intended for use as an undervoltage detector to signal a failing power supply, allowing the power source for the integrated circuit to be switched to a battery backup.

FIG. 1 depicts a bandgap circuit 102, and is employed in generating the reference voltage PFIREF. The output BGOUT of bandgap circuit 102 is equal to an upper power supply voltage VCC1 minus 1.25 V. For memory based products utilizing an n-type susbtrate, and therefore having vertical n-p-n transistors for the bandgap bipolars, where the n-type material for the collector is the substrate at VCC, the reference is to VCC rather than to VSS. An n-type substrate is preferable for poly-r memory cells due to its greater immunity to alpha particles.

The output BGOUT of bandgap circuit 102 depicted in FIG. 1 is input to a reference voltage circuit 202 depicted in FIG. 2. Reference voltage circuit 202 converts the voltage of BGOUT (VCC1−1.25V) to a reference voltage PFIREF having a voltage of 1.25 V, the required reference voltage value for the PFI/PFO function described above. The current through resistor R2 is the upper power supply voltage VCC1 minus 1.25 volts minus the threshold voltage of n-channel transistor MN2, all divided by the resistance of resistor R2—that is, (VCC1−1.25V−Vt(MN2))/R2. This current is mirrored through p-channel transistor I400 via p-channel transistor I398. An n-channel transistor I301 is employed to create a voltage drop such that the drain voltage of transistor I400 is close to the drain voltage of transistor I398—i.e., the voltage of node N3 is approximately equal to the voltage of node N14, which provides better matching of the currents through transistors I398 and I400.

The current through transistor I400 is mirrored to n-channel transistor I402 via n-channel transistor I401. The output voltage PFIREF taken from the drain of transistor I402 is therefore equal to the upper power supply voltage VCC1 minus the threshold voltage of n-channel mirror transistor MN1 minus the current I through transistor I402 times the resistance R of n-channel transistor I396—that is, VCC1−Vt(MN1)−IR. The current I through transistor I402 should match the current through resistor R2, so that the expression for the output voltage PFIREF may be written as $$VCC1 - Vt(MN1) - R\left(\frac{VCC1 - 1.25\text{ V} - Vt(MN2)}{R2}\right)$$

If the threshold voltages of mirror transistors MN1 and MN2 are matched, and the resistance of resistor R2 matches the resistance of transistor I396, terms within this expression cancel and the output voltage PFIREF is equal to 1.25 V. Thus, by matching transistors MN1 and MN2 (and particularly their threshold voltages), transistors I398 and I400 transistors I401 and I402, and the currents through and resistances of resistor R2 and resistor I396, a reference voltage value of 1.25 V may be obtained.

In implementation, the body or bulk of mirror transistors MN1 and MN2 are tied to the respective sources so that there is no body effect. Transistors MN1 and MN2 are laid out as a matched pair and resistor R2 is laid out matched with resistor I396. Capacitors may be added for stability of the output voltage PFIREF. However, tests indicate variations of ±100 mV across several lots of the circuits depicted in FIGS. 1 and 2, which, if occurring entirely within the bandgap voltage, results in a variation of ±75 mV at the bandgap output due to the resistor ratios. Simulation of the reference voltage output PFIREF across temperature, voltage, and process corners is shown in Table I:

TABLE I

| Temp (° C.) | VCC (V) | MIN (V) | | NOM (V) | | MAX (V) | |
|---|---|---|---|---|---|---|---|
| 100 | 5.5 | 1.251 | | 1.245 | | 1.237 | |
| 0 | 5.5 | 1.252 | 126 $\mu$A | 1.246 | 149 $\mu$A | 1.239 | 175 $\mu$A |
| 100 | 4.0 | 1.252 | | 1.249 | | 1.246 | |
| 0 | 4.0 | 1.253 | | 1.251 | | 1.248 | |
| 100 | 2.4 | 1.250 | | 1.250 | | 1.249 | |
| 0 | 2.4 | 1.250 | | 1.250 | | 1.250 | |
| 100 | 2.0 | 1.250 | | 1.250 | | 1.250 | |
| 0 | 2.0 | 1.253 | | 1.250 | | 1.250 | |

The variation from 0° C. to 100° C. is 2 mV; the variation over process corners is 14 mV; and the maximum variation from the desired 1.25 V reference voltage is 13 mV. Because the desired output voltage PFIREF is achieved as a result of cancellation of terms within the expression for the output voltage, addition of trim capability to the circuits of FIG. 2 to adjust to the desired 1.25 V within acceptable tolerances is difficult as it may result in terms no longer canceling.

Figure 3:
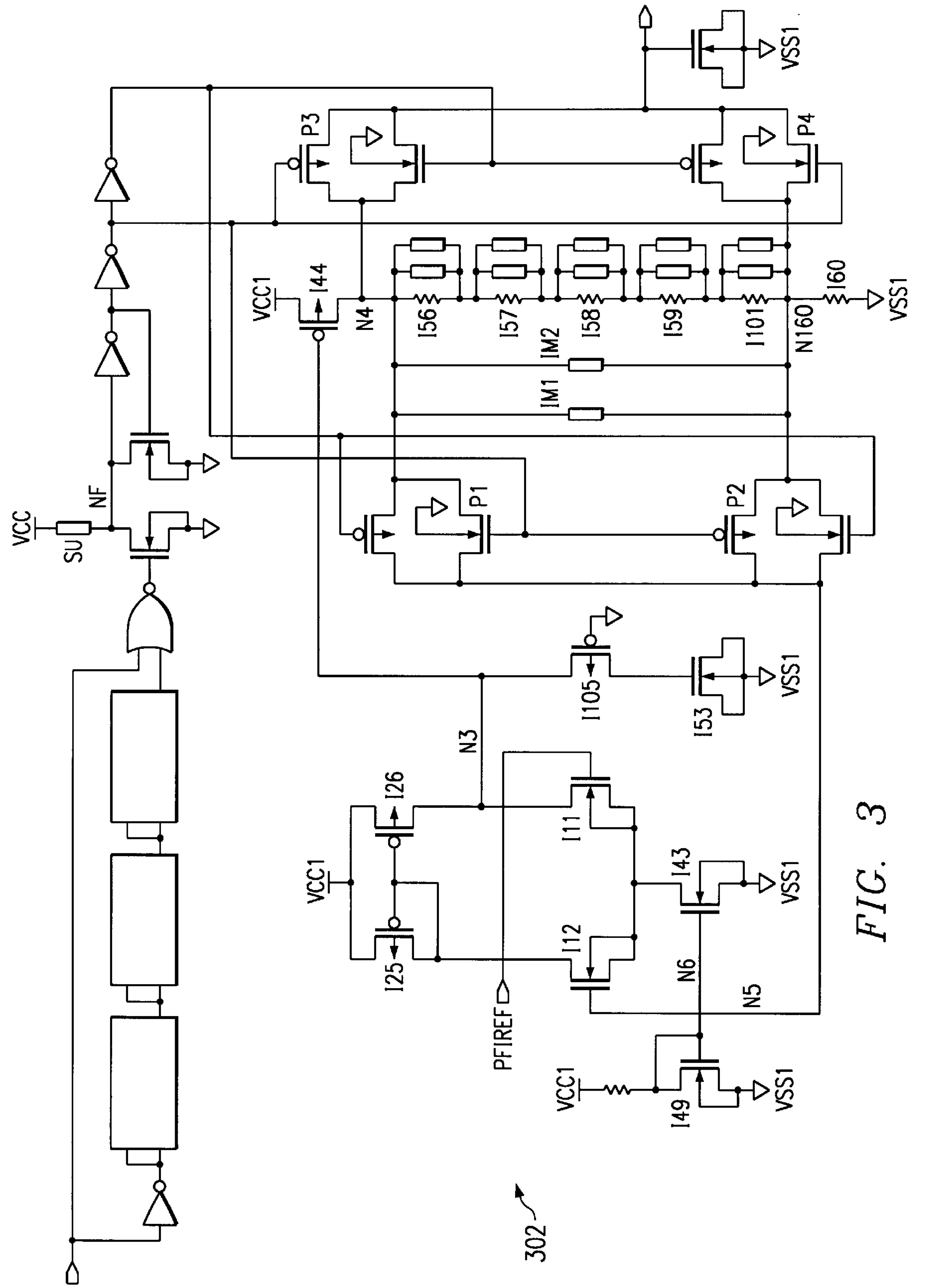
FIG. 3 is a circuit diagram for a reference voltage adjustment (or "trim") circuit in accordance with a preferred embodiment of the present invention.

Referring to FIG. 3, a circuit diagram for a reference voltage adjustment (or "trim") circuit in accordance with a preferred embodiment of the present invention is illustrated. Trim circuit 302 provides trim up/down capability to allow operation within a tightly spaced window. The input of trim circuit 302 receives the reference voltage, which in the depicted example is the reference voltage PFIREF from the output of the circuit depicted in FIG. 2. However, trim circuit 302 may be employed with any reference voltage, no matter how generated.

Trim circuit 302 includes a voltage follower circuit, which is equivalent to an operational amplifier with the output connected for unitary feedback to the negative input. The input reference voltage PRIREF is tied to one n-channel transistor I11 of a current mirror differential amplifier including n-channel transistors I11 and I12 and p-channel transistors I25 and I26. The output of the current mirror differential amplifier, node N3, controls p-channel transistor I44. Transistor I44 has a resistor I60 connected between the drain and the lower power supply voltage VSS1.

Two sets of pass gates P3 and P4 are connected between the output OUT and nodes N4 and N160, respectively, and select either node N4 or node N160 to be connected to the output OUT. Two additional sets of pass gates P1 and P2 are connected between node N5 and nodes N4 and N160, respectively, and select either node N4 or node N160 to be connected to node N5. Node N5 is the other input to the current mirror differential amplifier, tied to the gate of transistor I12. The voltage follower includes the current mirror differential amplifier and transistor I44 with its resistive load to ground. The current mirror differential amplifier and transistor I44 with its resistive load will regulate node N5 to be equal to the voltage at the input PFIREF. This is the stable point of operation; if the voltage at node N5 ever varies from the input voltage value PFIREF, the voltage will be driven back so that if the input PFIREF is 1.25 V then the voltage at node N5 will also be 1.25 V.

Trim capability is provided within trim circuit I44 by resistive loads I56, I57, I58, I59, and I101 serially connected at the output of the voltage follower between the source of transistor I44 (node N4) and resistive load I60 (node N160). Each resistive load I56, I57, I58, I59, and I101 is shunted by a corresponding pair of fuses, and the entire series of resistive loads is shunted by a pair of master fuses IM1 and IM2. The resistive loads I56, I57, I58, I59, and I101 have resistance values which provide a voltage drop or adjustment of 10 mV, 20 mV, 40 mV, 80 mV and 160 mV, respectively, and may be utilized in any combination. To trim the reference voltage, at least master fuses IM1 and IM2 must be blown; simply blowing master fuses IM1 and IM2 provides a voltage shift of 5 mV. Additional voltage shift is provide by blowing the fuse pairs shunting selected resistive loads I56, I57, I58, I59, and I101 to add additional resistance between nodes N4 and N160. For example, if a voltage shift of 35 mV is required, master fuses IM1 and IM2 should be blown together with the fuses shunting resistive loads I56 and I57. The fuses shunting resistive loads I58, I59, and I101 are left intact. Similarly, if a voltage shift of 95 mV is required, the master fuses IM1 and IM2 and the fuses shunting resistive loads I56 and I59 should be blown, leaving the fuses shunting resistive loads I57, I58, and I101 intact. This provides a total trim range of ±5, 15, 25 . . . 315 mV.

The reference voltage PFIREF is decremented by trim circuit 302 by leaving fuse SU connected between the upper power supply VCC and node NF intact. In that circumstance, passgates P1 and P4 will be on, while the other two passgates P2 and P3 will be off so that node N4 is connected to node N5, the second input of the current mirror differential amplifier, and node N160 is connected to the output OUT of trim circuit 302. Node N4 is at the input reference voltage level, nominally 1.25 V in the exemplary embodiment. Node N160 is shorted to node N4 when all fuses are intact. Fuses are selectively blown to provide downward trim. When master fuses IM1 and IM2 are blown, the output voltage OUT is decreased by 5 mV. Additional decreases to the output voltage OUT are achieved by blowing the fuses shunting whichever resistive loads I56, I57, I58, I59, and I101 combine with the 5 mV initial drop to achieve the desired voltage adjustment. For instance, an output voltage of 1.295 V may be trimmed to the desired 1.25 V by blowing the master fuses IM1 and IM2 and the fuses shunting resistive load I58.

The reference voltage PFIREF is incremented by trim circuit 302 by blowing fuse SU to turn off passgates P1 and P4 and turn on passgates P2 and P3. Node N160 in thus connected to node N5 and the second input to the current mirror differential amplifier, while node N4 is connected to the output OUT. With all other fuses left intact, node N4 is shorted to node N160. Blowing master fuses IM1 and IM2 will provide upward trim of 5 mV to the output of the voltage follower, and therefore to the reference voltage. Additional fuses across resistive loads I56, I57, I58, I59, and I101 may be blown to achieve additional upward trim in the same manner described above with respect to downward trim. As a result, the voltage level at the output OUT may be selectively shifted up in predefined increments.

Two master fuses IM1 and IM2 are provided across the entire series of fuseable resistive loads between nodes N4 and N160, and fuse pairs are employed across each individual resistive load I56, I57, I58, I59, and I101, to lower the resistance across nodes N4 and N160 as much as possible before any fuses are blown. A current source I49 (and node N6) may be implemented within the trim circuit 302 to make the circuit self contained, or a current source from another circuit amy be employed. Transistors I105 and I53 may be added for stability for AC analysis.

The reference voltage trim circuit of the present invention provides trim up and trim down capability to an reference or bias voltage without affecting the reference or bias voltage itself, and without unduly compromising the reference or bias voltage. The trim circuit may be employed with any type of reference or bias voltage. Simulations show no variation over process, voltage, or temperature.

While the invention has been particularly shown and described with reference to a preferred embodiment, it will be understood by those skilled in the art that various changes in form and detail may be made therein without departing from the spirit and scope of the invention.

What is claimed is:

1. A reference voltage trim circuit, comprising:

a voltage follower receiving a reference voltage and coupled to an output of the reference voltage trim circuit; and at least one resistive load coupled at a first end to an output of the voltage follower and at a second end to a lower power supply voltage;

wherein the at least one resistive load is selectively connected at the first end to an input of the voltage follower and at the second end to the output of the reference voltage trim circuit to decrement the reference voltage, and wherein the at least one resistive load is selectively connected at the second end to the input of the voltage follower and at the first end to the output of the reference voltage trim circuit to increment the reference voltage.

2. The reference voltage trim circuit of claim 1, wherein the voltage follower further comprises:

a current mirror differential amplifier including first and second inputs, one of the first and second inputs receiving the reference voltage and an other of the first and second inputs forming the input of the voltage follower to which an end of the at least one resistive load is selectively connected; and a transistor connected between an upper power supply voltage and the at least one resistive load, a gate of the transistor connected to an output of the current mirror differential amplifier.

3. The reference voltage trim circuit of claim 1, further comprising:

a first passgate connected between the first end of the at least one resistive load and the input of the voltage follower;

a second passgate connected between the first end of the at least one resistive load and the output of the reference voltage trim circuit;

a third passgate connected between the second end of the at least one resistive load and the input of the voltage follower;

a fourth passgate connected between the second end of the at least one resistive load and the output of the reference voltage trim circuit; and a shift direction fuse connected to control operation of the first, second, third and fourth passgates, wherein, when the shift direction fuse is intact, the first passgate connects the first end of the at least one resistive load to the input of the voltage follower, the second and third passgates are off, and the fourth passgate connects the second end of the at least one resistive load to the output of the reference voltage trim circuit, and wherein, when the shift direction fuse is blown, the first and fourth passgates are off, the second passgate connects the first end of the at least one resistive load to the output of the reference voltage trim circuit, and the third passgate connects the second end of the at least one resistive load to the input of the voltage follower.

4. The reference voltage trim circuit of claim 1, wherein the at least one resistive load further comprises:

a plurality of serially connected resistive loads each having a corresponding fuse connected across the resistive load.

5. The reference voltage trim circuit of claim 1, wherein each resistive load within the plurality of resistive loads has a different associated voltage.

6. The reference voltage trim circuit of claim 1, further comprising:

a master fuse connected across the first and second ends of the at least one resistive load.

7. A reference voltage trim circuit, comprising:

a resistive load coupled to a lower power supply voltage;

a voltage follower including a current mirror differential amplifier having a first input receiving a reference voltage and a second input coupled to an output of the reference voltage trim circuit, and a transistor connected between an upper power supply voltage and the resistive load, a gate of the transistor connected to an output of the current mirror differential amplifier;

a first passgate selectively connecting the second input of the current mirror differential amplifier to the connection between the transistor and the resistive load;

a second passgate selectively connecting the second input of the current mirror differential amplifier to the connection between the lower power supply voltage and the resistive load;

a third passgate selectively connecting the connection between the transistor and the resistive load to an output of the reference voltage trim circuit; and a fourth passgate selectively connecting the connection between the lower power supply voltage and the resistive load to the output of the reference voltage trim circuit.

8. The reference voltage trim circuit of claim 7, wherein the first and fourth passgates are turned on and the second and third passgates are kept off to decrement the reference voltage, and wherein the first and fourth passgates are kept off and the second and third passgates are turned on to increment the reference voltage.

9. The reference voltage trim circuit of claim 7, wherein the resistive load further comprises:

a plurality of resistors connected in series between the transistor and the lower power supply voltage, wherein each resistor is shunted by a fuse which is selectively blown to alter the reference voltage by a voltage corresponding to the respective resistor.

10. The reference voltage trim circuit of claim 7, further comprising:

a master fuse connected across the resistive load, wherein the master fuse must be blown to alter the reference voltage.

11. The reference voltage trim circuit of claim 7, wherein the current mirror differential amplifier further comprises:

a first n-channel transistor connected at a drain to the lower power supply voltage and at a source to the output of the current mirror differential amplifier, a gate of the first n-channel transistor connected to the first input of the voltage follower;

a second n-channel transistor connected at a drain to the lower power supply voltage, a gate of the second n-channel transistor connected to the second input of the voltage follower and to the drain of the second n-channel transistor;

a first p-channel transistor connected at a source to the upper power supply voltage and at a drain to the output of the current mirror differential amplifier; and a second p-channel transistor connected at a source to the upper power supply voltage and at a drain to the source of the second n-channel transistor, a gate of the second p-channel transistor connected to a gate of the first p-channel transistor and to the drain of the second p-channel transistor.

12. The reference voltage trim circuit of claim 7, further comprising:

first and second inverters connected in series, wherein an input of the first inverter is connected to a shift direction signal controlled by a shift direction fuse, wherein an output of the first inverter is connected to a gate of an n-channel transistor within the first passgate, a gate of a p-channel transistor within the second passgate, a gate of a p-channel transistor within the third passgate, and a gate of an n-channel transistor within the fourth passgate, wherein an output of the second inverter is connected to a gate of a p-channel transistor within the first passgate, a gate of an n-channel transistor within the second passgate, a gate of an n-channel transistor within the third passgate, and a gate of a p-channel transistor within the fourth passgate; and a third inverter having an input connected to the shift direction fuse and to a source of a transistor and an output connected to the input of the first inverter and to a gate of the transistor, wherein a drain of the transistor is connected to a ground voltage and the shift direction fuse is connected to the upper power supply voltage.

13. A method of trimming a reference voltage within a reference voltage trim circuit including a voltage follower receiving a reference voltage and coupled to an output of the reference voltage trim circuit, and a resistive load coupled between a lower power supply voltage and an output of the voltage follower, the method comprising:

selectively connecting a connection between the output of the voltage follower and the resistive load to an input of the voltage follower, and a connection between the lower power supply voltage and the resistive load to the output of the reference voltage trim circuit to decrement the reference voltage; and selectively connecting the connection between the lower power supply voltage and the resistive load to the input of the voltage follower, and the connection between the output of the voltage follower and the resistive load to an output of the reference voltage trim circuit to increment the reference voltage.

14. The method of claim 13, wherein the step of selectively connecting a connection between the output of the voltage follower and the resistive load to an input of the voltage follower, and the connection between the lower power supply voltage and the resistive load to the output of the reference voltage trim circuit to decrement the reference voltage further comprises:

turning on a first passgate connecting the connection between the output of the voltage follower and the resistive load to the input of the voltage follower;

keeping off a second passgate connecting the connection between the lower power supply voltage and the resistive load to the input of the voltage follower;

keeping off a third passgate connecting the connection between the output of the voltage follower and the resistive load to an output of the reference voltage trim circuit; and turning on a fourth passgate connecting the connection between the lower power supply voltage and the resistive load to the output of the reference voltage trim circuit.

15. The method of claim 13, wherein the step of selectively connecting the connection between the lower power supply voltage and the resistive load to the input of the voltage follower, and the connection between the output of the voltage follower and the resistive load to an output of the reference voltage trim circuit to increment the reference voltage further comprises:

keeping off a first passgate connecting the connection between the output of the voltage follower and the resistive load to the input of the voltage follower;

turning on a second passgate connecting the connection between the lower power supply voltage and the resistive load to the input of the voltage follower;

turning on a third passgate connecting the connection between the output of the voltage follower and the resistive load to an output of the reference voltage trim circuit; and keeping off a fourth passgate connecting the connection between the lower power supply voltage and the resistive load to the output of the reference voltage trim circuit.

16. The method of claim 13, wherein the step of connecting a resistive load between a lower power supply voltage and the output of the voltage follower further comprises:

selectively connecting a series of resistors between the lower power supply voltage and the output of the voltage follower, wherein a fuse connected across each resistor within the series of resistors must be blown to alter the reference voltage.

17. The method of claim 13, further comprising:

providing a shift direction fuse controlling a direction in which the resistive load alters the reference voltage.

* * * * *